(12) United States Patent
Aoki et al.

(10) Patent No.: US 7,521,268 B2
(45) Date of Patent: Apr. 21, 2009

(54) METHOD AND APPARATUS FOR MANUFACTURING DISPLAY

(75) Inventors: Motonobu Aoki, Ishikawa-gun (JP); Tetsuo Ishida, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 453 days.

(21) Appl. No.: 11/208,608

(22) Filed: Aug. 23, 2005

(65) Prior Publication Data

US 2006/0057750 A1 Mar. 16, 2006

(30) Foreign Application Priority Data

Sep. 14, 2004 (JP) .............................. 2004-267021

(51) Int. Cl.
*H01L 21/00* (2006.01)
(52) U.S. Cl. .................................. 438/22; 257/E29.245
(58) Field of Classification Search .................. 438/22
See application file for complete search history.

(56) References Cited

U.S. PATENT DOCUMENTS 6,547,922 B2 * 4/2003 Hori et al. ............... 156/345.37
7,239,804 B2 * 7/2007 Yoshimura .................. 392/418

FOREIGN PATENT DOCUMENTS

| JP | 07-216550 | * | 8/1995 |
| JP | 9-217169 | | 8/1997 |
| JP | 2004-29468 | | 1/2004 |
| TW | 513597 | | 12/2002 |
| TW | 514960 | | 12/2002 |
| WO | WO 01/05194 A1 | | 1/2001 |

OTHER PUBLICATIONS

"Theory and Practice of Far Infrared Heating"; Japan Electro-Heat Association; pp. 75-76; Mar. 10, 1991; Ohmsha, Ltd.

* cited by examiner

*Primary Examiner*—Asok K Sarkar
(74) *Attorney, Agent, or Firm*—Oblon, Spivak, McClelland, Maier & Neustadt, P.C.

(57) ABSTRACT

Provided is a method of manufacturing a display which includes an insulating substrate and a structure formed on the insulating substrate and including a display element, including forming a patterned layer as a portion of the structure on the insulating substrate by vapor deposition in vacuum using a mask, and cooling the insulating substrate before and/or during formation of the patterned layer by arranging a cooling plate which comprises a metal substrate and an infrared absorption layer covering a main surface of the metal substrate and being larger in infrared absorptance than the metal plate such that the infrared absorption layer faces the insulating substrate.

11 Claims, 3 Drawing Sheets

METHOD AND APPARATUS FOR MANUFACTURING DISPLAY

CROSS-REFERENCE TO RELATED APPLICATIONS

This application is based upon and claims the benefit of priority from prior Japanese Patent Application No. 2004-267021, filed Sep. 14, 2004, the entire contents of which are incorporated herein by reference.

BACKGROUND OF THE INVENTION

1. Field of the Invention

The present invention relates to a method and apparatus for manufacturing a display and, more particularly, to a method and apparatus for manufacturing a display whose manufacturing process includes forming a patterned layer on an insulating substrate by vapor deposition in vacuum using a mask.

2. Description of the Related Art

In the manufacture of a flat panel display, a patterned layer is sometimes formed on an insulating substrate by vapor deposition in vacuum using a mask. For example, in the manufacture of an organic electroluminescent (EL) display, an organic layer of an organic EL element is sometimes formed by vacuum evaporation using a mask having an aperture corresponding to each organic EL element.

The existence of water significantly shortens the lifetime of the organic EL element. In the manufacture of an organic EL display, therefore, an insulating substrate is normally heated in vacuum for the purpose of drying before an organic layer is formed. Subsequently, an organic layer is formed without breaking the vacuum.

In this method, drying and film formation are successively performed in vacuum. This makes it difficult to well cool the insulating substrate before the formation of the organic layer is started. As a consequence, the organic layer is formed on the thermally expanded insulating substrate.

Also, in a film formation method such as vacuum evaporation or sputtering, it is originally unnecessary to heat a substrate on which a layer is to be formed. In practice, however, even if the substrate temperature is about room temperature before film formation, it sometimes reaches, e.g., 70° C. or more immediately after film formation.

An organic layer of an organic EL element may contain a hole transporting layer and electron transporting layer in addition to a light-emitting layer. Also, when an organic EL display is designed to be able to display color images, light-emitting layers which emit blue light, green light, and red light are formed in some cases. Therefore, to form an organic layer, it is sometimes necessary to sequentially form a hole transporting layer, blue-emitting layer, green-emitting layer, red-emitting layer, and electron transporting layer.

As described above, the substrate temperature rises by film formation. When film formation for forming an organic layer is performed a plurality of number of times, therefore, not only the substrate temperature rises during film formation, but also the substrate temperature raised by certain film formation has influence on the substrate temperature of film formation performed after that.

As described above, the substrate temperature when a certain layer is formed is affected by heat produced by the formation of that layer and by the substrate temperature at the time the formation of the layer is started. Accordingly, especially when a multilayered structure is used as an organic layer or a plurality of types of light-emitting layers different in emission color are to be formed, the substrate temperature during film formation is difficult to accurately control.

The temperature of an insulating substrate has influence on its dimensions. Therefore, if the substrate temperature during film formation cannot be accurately controlled, each layer cannot be formed in a designed position any longer. If the positional accuracy of each constituent element formed on an insulating substrate is low, it is impossible to realize designed performance.

BRIEF SUMMARY OF THE INVENTION

It is an object of the present invention to accurately control the substrate temperature when film formation is performed by vapor deposition using a mask, thereby increasing the positional accuracy of each thin film.

According to a first aspect of the present invention, there is provided a method of manufacturing a display which comprises an insulating substrate and a structure formed on the insulating substrate and including a display element, comprising forming a patterned layer as a portion of the structure on the insulating substrate by vapor deposition in vacuum using a mask, and cooling the insulating substrate before and/or during formation of the patterned layer by arranging a cooling plate which comprises a metal substrate and an infrared absorption layer covering a main surface of the metal substrate and being larger in infrared absorptance than the metal plate such that the infrared absorption layer faces the insulating substrate.

According to a second aspect of the present invention, there is provided a method of manufacturing a display which comprises an insulating substrate and a structure formed on the insulating substrate and including a display element, comprising arranging the insulating substrate and a first cooling plate which comprises a first metal substrate and a first infrared absorption layer covering a main surface of the first metal substrate and being larger in infrared absorptance than the first metal plate in vacuum such that the first infrared absorption layer faces a first main surface of the insulating substrate, and in this state, forming a first patterned layer as a portion of the structure on a second main surface of the insulating substrate by vapor deposition using a first mask.

According to a third aspect of the present invention, there is provided a method of manufacturing a display which comprises an insulating substrate and a structure formed on the insulating substrate and including a display element, comprising heating the insulating substrate in vacuum, cooling the heated insulating substrate in vacuum by arranging the insulating substrate and a first cooling plate which comprises a first metal substrate and a first infrared absorption layer covering a main surface of the first metal substrate and being larger in infrared absorptance than the first metal plate such that the first infrared absorption layer faces the insulating substrate, and forming a patterned layer as a portion of the structure on the cooled insulating substrate by vapor deposition in vacuum using a mask.

According to a fourth aspect of the present invention, there is provided an apparatus of manufacturing a display which comprises an insulating substrate and a structure formed on the insulating substrate and including a display element, comprising a vacuum chamber into which the insulating substrate is transferred, a material source which is arranged in the vacuum chamber and vaporizes a material of a patterned layer as a portion of the structure to supply a main surface of the insulating substrate in the vacuum chamber with the vaporized material, a mask which is arranged between the material source and the insulating substrate in the vacuum chamber, and a cooling plate which comprises a metal substrate and an infrared absorption layer covering a main surface of the metal substrate and being larger in infrared absorptance than the metal plate and is arranged such that the infrared absorption layer faces the insulating substrate before and/or during the material source supplies the main surface of the insulating substrate with the vaporized material.

According to a fifth aspect of the present invention, there is provided an apparatus of manufacturing a display which comprises an insulating substrate and a structure formed on the insulating substrate and including a display element, comprising a first vacuum chamber into which the insulating substrate is transferred, a first material source which is arranged in the first vacuum chamber and vaporizes a first material of a first patterned layer as a portion of the structure to supply a first main surface of the insulating substrate in the first vacuum chamber with the vaporized first material, a first mask which is arranged between the first material source and the insulating substrate in the first vacuum chamber, and a first cooling plate which comprises a first metal substrate and a first infrared absorption layer covering a main surface of the first metal substrate and being larger in infrared absorptance than the first metal plate and is arranged in the first vacuum chamber such that the first infrared absorption layer faces a second main surface of the insulating substrate in the first vacuum chamber.

According to a sixth aspect of the present invention, there is provided an apparatus of manufacturing a display which comprises an insulating substrate and a structure formed on the insulating substrate and including a display element, comprising a first vacuum chamber into which the insulating substrate is transferred, a heater which heats the insulating substrate in the first vacuum chamber, a second vacuum chamber into which the insulating substrate is transferred from the first vacuum chamber, a first cooling plate which comprises a first metal substrate and a first infrared absorption layer covering a main surface of the first metal substrate and being larger in infrared absorptance than the first metal plate and is arranged in the second vacuum chamber such that the first infrared absorption layer faces the insulating substrate in the second vacuum chamber, a third vacuum chamber into which the insulating substrate is transferred from the second vacuum chamber, a material source which is arranged in the third vacuum chamber and vaporizes a material of a patterned layer as a portion of the structure to supply a main surface of the insulating substrate in the third vacuum chamber with the vaporized material, and a mask which is arranged between the material source and the insulating substrate in the third vacuum chamber.

DETAILED DESCRIPTION OF THE INVENTION

Figure 1:
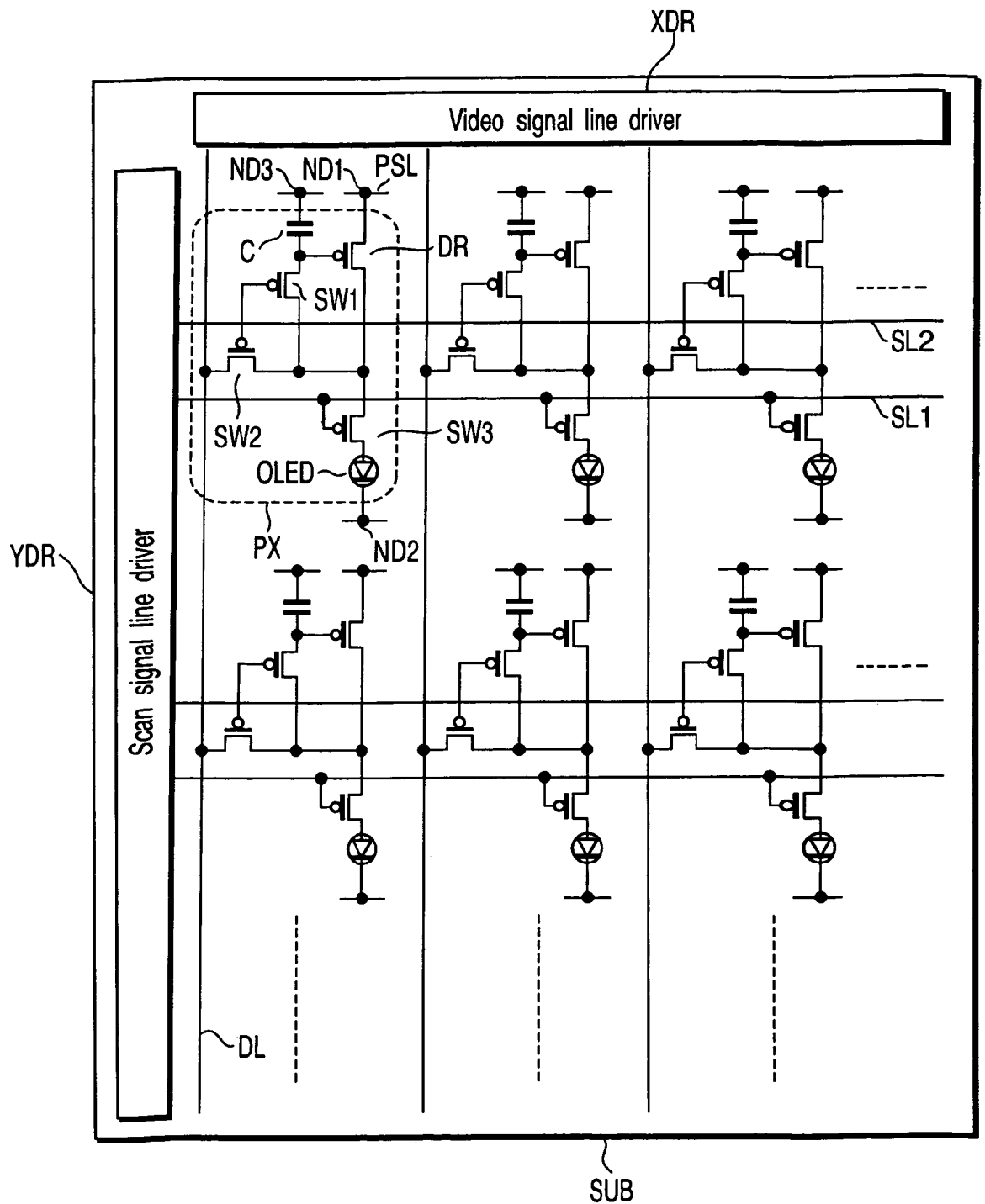
FIG. 1 is a plan view schematically showing an example of a display which can be manufactured by a method according to an embodiment of the present invention.

An embodiment of the present invention will be described in detail below with reference to the accompanying drawing. Note that in the drawing, the same reference numerals denote constituent elements having the same or similar functions, and a repetitive explanation thereof will be omitted.

FIG. 1 is a plan view schematically showing an example of a display which can be manufactured by a method according to an embodiment of the present invention. That is, FIG. 1 shows an active matrix organic EL display as an example.

This organic EL display includes a plurality of pixels PX. The pixels PX are arranged in a matrix form on an insulating substrate SUB such as a glass substrate.

On the substrate SUB, a scan signal line driver YDR and video signal line driver XDR are also arranged.

On the substrate SUB, scan signal lines SL1 and SL2 connected to the scan signal line driver YDR run in the row direction of the matrix of pixels PX. The scan signal line driver YDR supplies scan signals as voltage signals to the scan signal lines SL1 and SL2.

In addition, on the substrate SUB, video signal lines DL connected to the video signal line driver XDR run in the column direction of the matrix of pixels PX. The video signal line driver XDR supplies video signals to the vide signal lines DL.

Furthermore, a power supply line PSL is formed on the substrate SUB.

Each pixel PX includes a pixel circuit, and an organic EL element OLED as a display element. The pixel circuit includes a drive control element DR, diode connecting switch SW1, video signal supply control switch SW2, output control switch SW3, and capacitor C.

The organic EL element OLED includes an anode and cathode facing each other, and an organic layer which changes its optical characteristics in accordance with an electric current which flows between the anode and cathode. As an example, assume that the anode is formed as a lower electrode, and the cathode is formed as an upper electrode which faces the lower electrode via the organic layer.

The drive control element DR is, e.g., a thin film transistor (to be referred to as a TFT hereinafter) in which a source, drain, and channel are formed in a polycrystalline semiconductor layer. As an example, a p-channel TFT having a polysilicon layer as this polycrystalline semiconductor layer is used as the drive control element DR. The source of the drive control element DR is connected to the power supply line PSL. Note that a node ND1 on the power supply line PSL is a first power supply terminal.

The diode connecting switch SW1 is connected between the drain and gate of the drive control element DR. A switching operation of the diode connecting switch SW1 is controlled by, e.g., a scan signal supplied from the scan signal line driver YDR via the scan signal line SL2. For example, a p-channel TFT is used as the diode connecting switch SW1, and the gate of this TFT is connected to the scan signal line SL2.

The video signal supply control switch SW2 is connected between the drain of the drive control element DR and the video signal line DL. For example, a p-channel TFT is used as the video signal supply control switch SW2, and the gate of this TFT is connected to the scan signal line SL2.

The output control switch SW3 and display element OLED are connected in series between the drain of the drive control element DR and a second power supply terminal ND2. In this embodiment, a p-channel TFT is used as the video signal supply control switch SW3, the gate of this TFT is connected to the scan signal line SL1, and the source and drain of the TFT are connected to the drain of the drive control element DR and the anode of the display element OLED, respectively. The electric potential of the second power supply terminal ND2 is lower than that of the first power supply terminal ND1.

One electrode of the capacitor C is connected to the gate of the drive control element DR. In a display period following a write period, the capacitor C holds the electric potential of the gate of the drive control element DR substantially constant. As an example, the capacitor C is connected between a constant-potential terminal ND3 and the gate of the drive control element DR.

Figure 2:
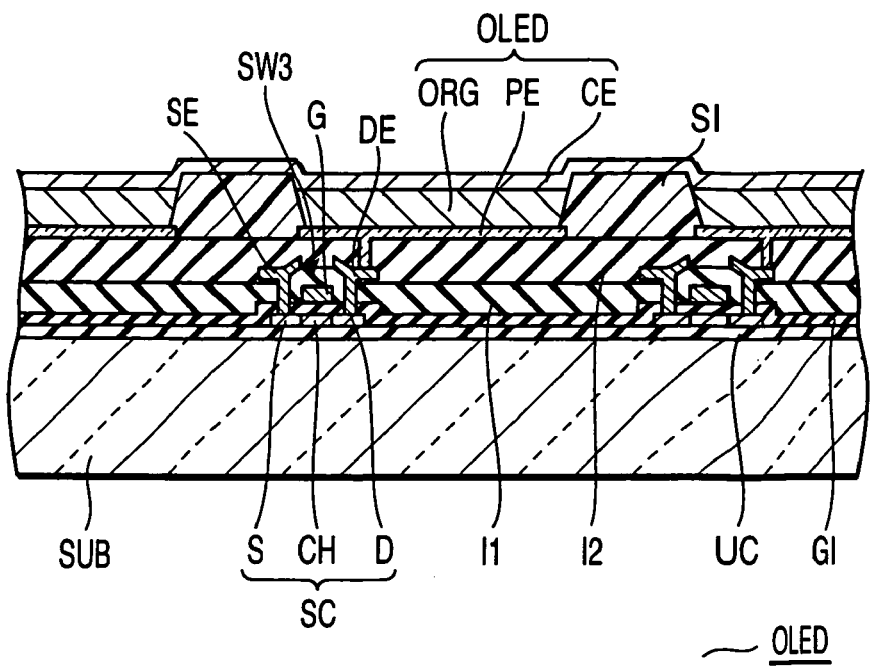
FIG. 2 is a sectional view showing an example of a structure usable in the display shown in FIG. 1.

FIG. 2 is a sectional view showing an example of a structure which can be used in the display shown in FIG. 1. Although FIG. 2 shows only the output control switch SW3 as a TFT, the diode connecting switch SW1 and video signal supply control switch SW2 have the same structure as the output control switch SW3. Also, the drive control element DR has substantially the same structure as the output control switch SW3.

As shown in FIG. 2, an undercoat layer UC is formed on one major surface of the insulating substrate SUB. The undercoat layer UC is, e.g., a stacked structure of an $SiN_x$ layer and $SiO_2$ layer.

On the undercoat layer UC, patterned polysilicon layers are formed as semiconductor layers SC. In each semiconductor layer SC, a source S and drain D of a TFT are formed apart from each other. A region CH between the source S and drain D in the semiconductor layer SC is used as a channel.

A gate insulator GI is formed on the semiconductor layer SC, and first conductor patterns and an insulating film I1 are sequentially formed on the gate insulator GI. The first conductor patterns are used as a gate G of the TFT, a first electrode (not shown) of the capacitor C, the scan signal lines SL1 and SL2, and interconnections which connect these elements. The insulating film I1 is used as an interlayer dielectric film and a dielectric layer of the capacitor C.

Second conductor patterns are formed on the insulating film I1. The second conductor patterns are used as a source electrode SE, a drain electrode DE, a second electrode (not shown) of the capacitor C, the video signal lines DL, the power supply line PSL, and interconnections which connect these elements. In the positions of through holes formed in the insulating films GI and I1, the source electrode SE and drain electrode DE are connected to the source S and drain D, respectively, of the TFT.

An insulating film I2 and third conductor patterns are sequentially formed on the second conductor patterns and the insulating film I1. The insulating film I2 is used as a passivation film and/or a planarizing layer. The third conductor patterns are used as pixel electrodes PE of the organic EL elements OLED. As an example, the pixel electrode PE is an anode.

A through hole is formed in the insulating film I2 for each pixel PX. This through hole reaches the source electrode SE connected to the source S of the output control switch SW3. Each pixel electrode PE covers the side walls and bottom surface of the through hole, thereby connecting to the source S of the output control switch SW3 via the source electrode SE.

A partition insulating layer SI is formed on the insulating film I2. For example, an organic insulating layer is used as the partition insulating layer SI.

The partition insulating layer SI has through holes in the positions of the pixel electrodes PE. In each through hole of the partition insulating layer SI, an organic layer ORG including a light-emitting layer covers the pixel electrode PE. The light-emitting layer is, e.g., a thin film containing a red, green, or blue luminescent organic compound. In addition to this light-emitting layer, the organic layer ORG can further include, e.g., a hole injecting layer, hole transporting layer, electron injecting layer, electron transporting layer, and hole blocking layer. When a low-molecular organic compound is used as each layer of the organic layer ORG, these layers can be formed by, e.g., vacuum evaporation using a mask.

A common electrode CE is formed on the partition insulating layer SI and organic layer ORG. The common electrode CE is electrically connected to an electrode interconnection which provides the node ND2, via a contact hole (not shown) formed through the insulating films I1 and I2 and partition insulating film SI. In this embodiment, the common electrode CE is a cathode.

Each organic EL element OLED is made up of the pixel electrode PE, organic layer ORG, and common electrode CE.

Figure 3:
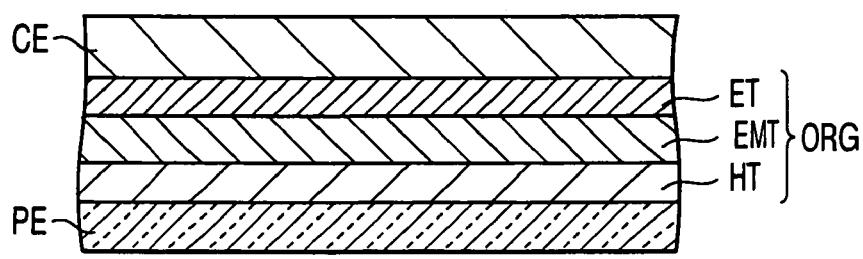
FIG. 3 is a sectional view schematically showing an example of a structure usable in a display element shown in FIG. 2.

FIG. 3 is a sectional view schematically showing an example of a structure usable in the organic EL element OLED shown in FIG. 2.

The organic EL element OLED shown in FIG. 3 includes the pixel electrode PE as an anode, the common electrode CE as a cathode, and the organic layer ORG interposed between them.

In this example, the organic layer ORG includes a light-emitting layer EMT, hole transporting layer HT, and electron transporting layer ET. The hole-transporting layer HT is interposed between the light-emitting layer EMT and the pixel electrode PE. The electron transporting layer ET is interposed between the light-emitting layer EMT and the common electrode CE as a cathode.

Figure 4:
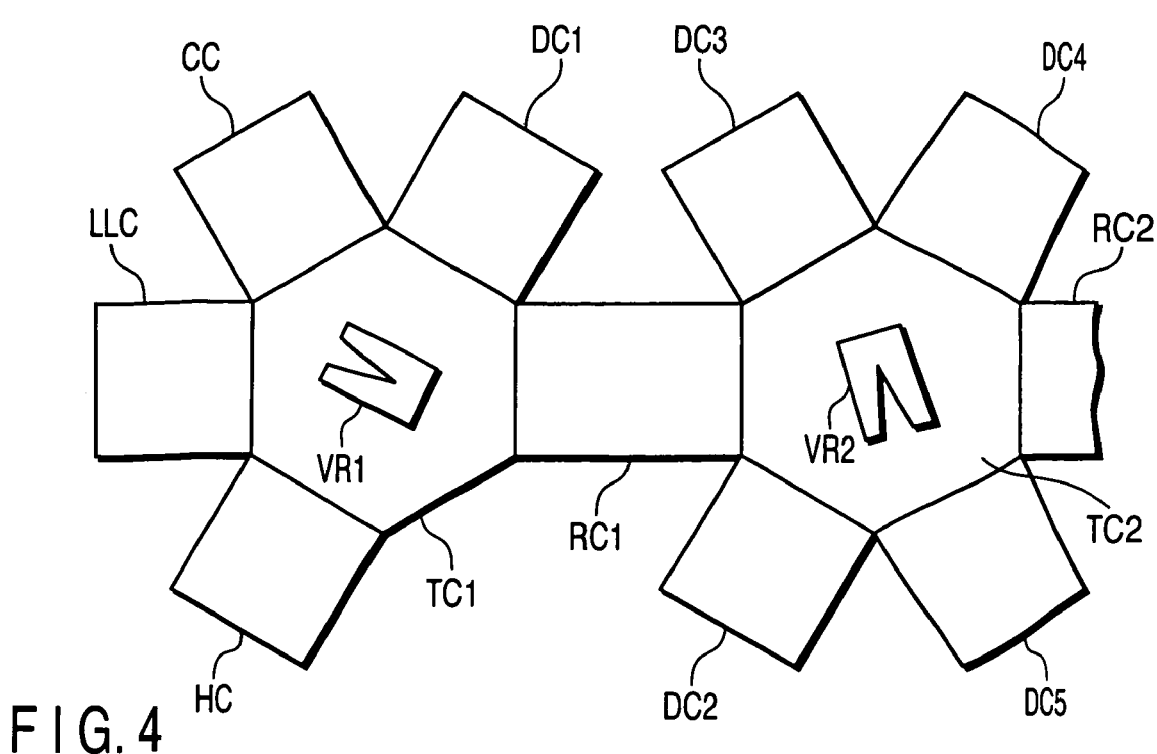
FIG. 4 is a plan view schematically showing a manufacturing apparatus according to the embodiment of the present invention.
Figure 5:
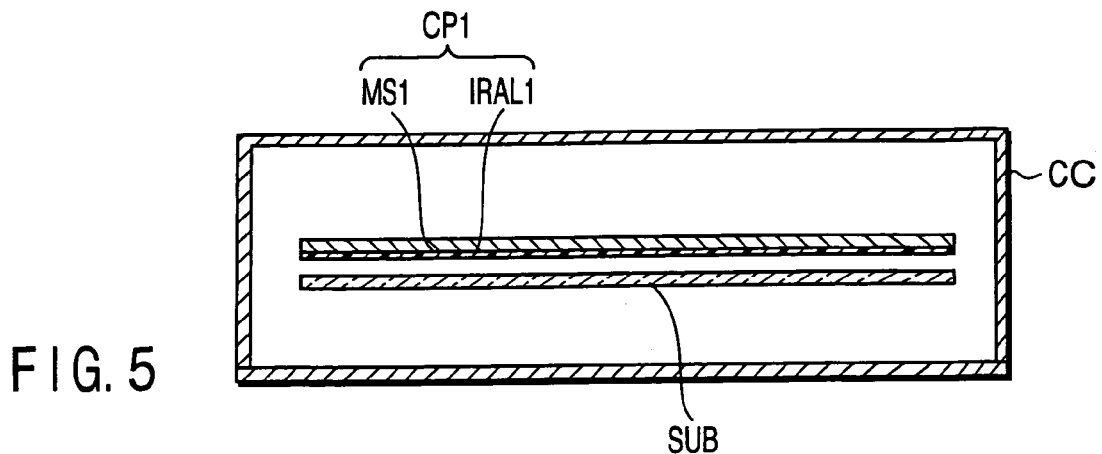
FIG. 5 is a sectional view schematically showing an example of a cooling chamber usable in the manufacturing apparatus shown in FIG. 4.
Figure 6:
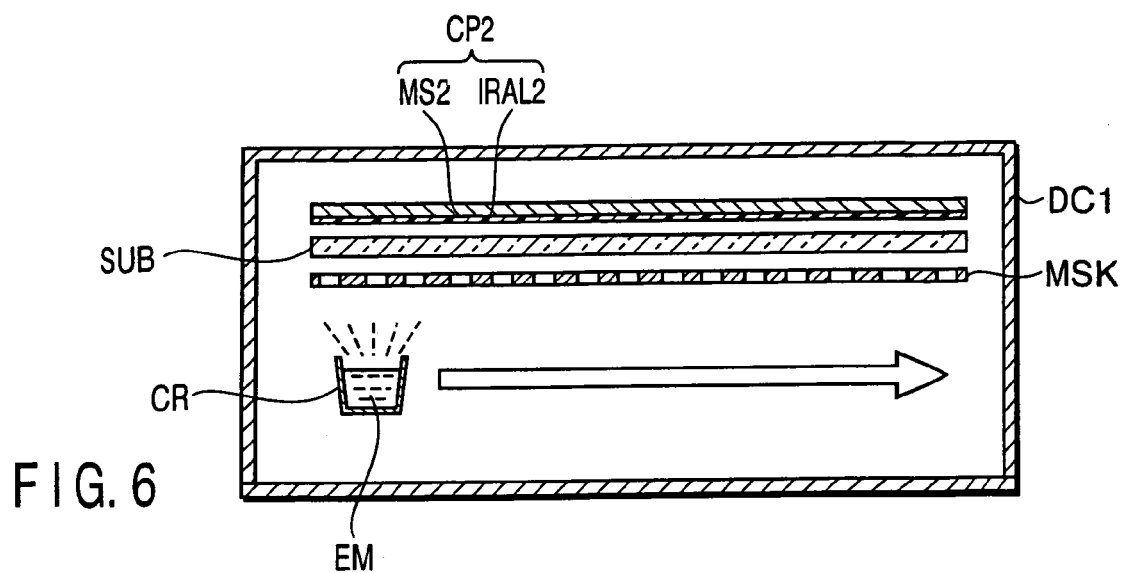
FIG. 6 is a sectional view schematically showing an example of a deposition chamber usable in the manufacturing apparatus shown in FIG. 4.
Figure 7:
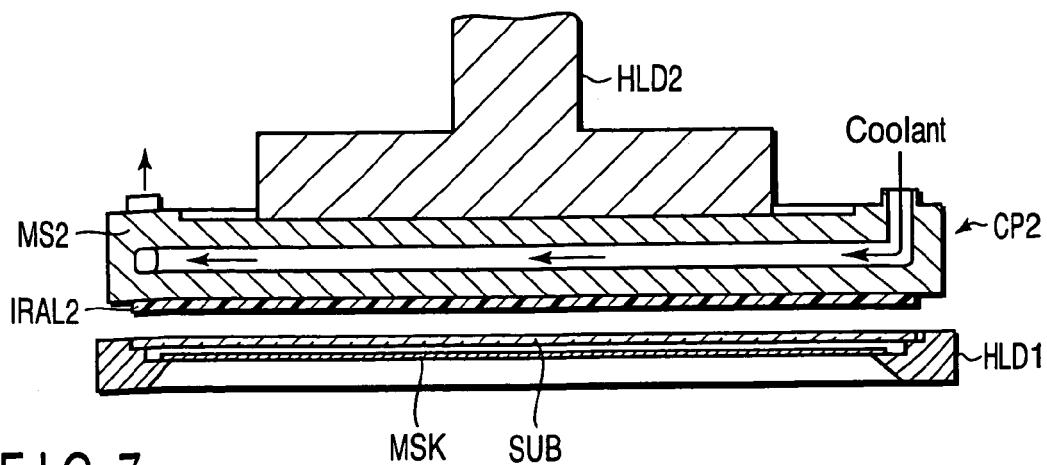
FIG. 7 is a sectional view schematically showing examples of devices arranged inside the deposition chamber shown in FIG. 6.

FIG. 4 is a plan view schematically showing a manufacturing apparatus according to the embodiment of the present invention. FIG. 5 is a sectional view schematically showing an example of a cooling chamber usable in the manufacturing apparatus shown in FIG. 4. FIG. 5 is a sectional view schematically showing an example of a deposition chamber usable in the manufacturing apparatus shown in FIG. 4. FIG. 7 is a sectional view schematically showing examples of devices arranged inside the deposition chamber shown in FIG. 6.

The manufacturing apparatus shown in FIG. 4 is a single-substrate processing apparatus including multi-chamber system. This manufacturing apparatus includes a load-lock chamber LLC, transfer chambers TC1 and TC2, heating chamber HC, cooling chamber CC, deposition chambers DC1 to DC5, and relay chamber RC1.

An evacuation system (not shown) is connected to each chamber. During the manufacture, chambers except for the load-lock chamber LLC are kept evacuated.

The load-lock chamber LLC contains a transfer table (not shown) on which the insulating substrate SUB is placed. In addition, a pair of gate valves (not shown) are attached to the load-lock chamber LLC. The load-lock chamber LLC is connected to the transfer chamber TC1 via one of these gate valves.

A cassette station or the like is placed near the other gate valve attached to the load-lock chamber LLC. By combining the opening/closing operations of these gate valves and the operation of the evacuation system, the load-lock chamber LLC can load the insulating substrate SUB into the transfer chamber TC1 from the cassette station without exposing the transfer chamber TC1 to the atmosphere.

A vacuum robot VR1 is placed in the transfer chamber TC1. Also, the heating chamber HC, cooling chamber CC, deposition chamber DC1, and relay chamber RC1 are connected to the transfer chamber TC1 via gate valves (not shown). The vacuum robot VR1 unloads the insulating substrate SUB from the transfer chamber TC1 to the heating camber HC, cooling chamber CC, deposition chamber DC1, and relay chamber RC1, and loads the insulating substrate SUB into the transfer chamber TC1 from the load-lock chamber LLC, heating chamber HC, cooling chamber CC, and deposition chamber DC1.

The heating chamber HC contains a substrate holder (not shown) for holding the insulating substrate SUB or a table (not shown) on which the insulating substrate SUB is placed, and a heater (not shown). In the heating chamber HC, the insulating substrate SUB is dried by heating in vacuum.

As shown in FIG. 5, the cooling chamber CC contains a cooling plate CP1, and a substrate holder (not shown) for holding the insulating substrate SUB or a table (not shown) on which the insulating substrate SUB is placed.

The cooling plate CP1 is made up of a metal substrate MS1, and an infrared absorption layer IRAL1 which covers one major surface of the metal substrate MS1 and has infrared absorptance larger than that of the metal substrate MS1.

In the cooling chamber CC, the cooling plate CP1 is posited near the insulating substrate SUB so that the infrared absorption layer IRAL1 faces the insulating substrate SUB. In this manner, the insulating substrate SUB is cooled by allowing the cooling plate CP1 to absorb infrared radiation emitted from the insulating substrate SUB.

The cooling plate CP1 typically has a structure in which heat from the metal substrate MS1 is radiated outside the cooling chamber CC. For example, it is possible to use a structure in which a channel is formed inside or adjacent to the metal substrate MS1, and the metal substrate MS1 is cooled by supplying a coolant such as water to this channel. It is also possible to use a structure in which heat from the metal substrate MS1 can be radiated outside the cooling chamber CC via a good thermal conductor.

The distance between the insulating substrate SUB and cooling plate CP1 can be changed. This mechanism makes it possible to facilitate loading/unloading of the insulating substrate SUB into/from the cooling chamber CC, and adjust the cooling effect of the cooling plate CP1.

In this example, the deposition chamber DC1 is a vacuum evaporation chamber for forming the hole transporting layer HT. As shown in FIG. 6, the deposition chamber DC1 contains an evaporation material EM which is the material of a thin film to be deposited and, in this example, a hole transporting material, a crucible CR containing the evaporation material EM, a mask MSK, and a cooling plate CP2. In addition, the film formation chamber DC1 contains a substrate holder HLD1 and cooling plate holder HLD2.

The substrate holder HLD1 supports the edge of the insulating substrate SUB. The substrate holder HLD1 detachably holds the insulating substrate SUB such that its film formation surface opposes the crucible CR. In this example, the substrate holder HLD1 also functions as a mask holder for holding the mask MSK.

The crucible CR generates heat by itself when power is supplied, or is heated by a heater such as a separately formed resistance heater. By raising the temperature of the crucible CR, the evaporation material EM contained in it is evaporated. Typically, in order to evenly supply the vaporized evaporation material EM to the film formation surface of the insulating substrate SUB, the crucible CR is moved relative to the insulating substrate SUB by a driving mechanism (not shown), in a direction substantially parallel to the major surface of the insulating substrate SUB, e.g., in a direction indicated by the arrow in FIG. 6. As an example, the crucible CR is heated to 350° C., and the distance from the crucible CR to the insulating substrate SUB is about 500 mm.

The mask MSK is placed in a position between the crucible CR and insulating substrate SUB, and near the insulating substrate SUB. In this example, the mask MSK has apertures in positions corresponding to the organic layers ORG.

The cooling plate CP2 is made up of a metal substrate MS2, and an infrared absorption layer IRAL2 which covers one major surface of the metal substrate MS2 and has an infrared absorptance larger than that of the metal substrate MS2. In the deposition chamber DC1, the cooling plate CP is positioned near the insulating substrate SUB so that the infrared absorption layer IRAL2 faces the surface opposite to the film formation surface of the insulating substrate SUB. In this manner, the insulating substrate SUB is cooled by allowing the cooling plate CP2 to absorb infrared radiation emitted from the insulating substrate SUB.

The cooling plate CP2 typically has a structure in which heat from the metal substrate MS2 is radiated outside the deposition chamber DC1. For example, as shown in FIG. 7, it is possible to use a structure in which a channel is formed inside or adjacent to the metal substrate MS2, and the metal substrate MS2 is cooled by supplying a coolant such as water to this channel. It is also possible to use a structure in which heat from the metal substrate MS2 can be radiated outside the deposition chamber DC1 via a good thermal conductor.

The cooling plate holder HLD2 supports the cooling plate CP2. The cooling plate holder HLD2 holds the cooling plate CP2 such that the infrared absorption layer IRAL2 faces the insulating substrate SUB. The cooling plate holder HLD2 can have a structure capable of detachably holding the cooling plate CP2. For example, it is possible to attach a magnet to the cooling plate holder HLD2, and hold the cooling plate CP2 by using the magnetic force.

The distance between the insulating substrate SUB and cooling plate CP2 can be changed. For example, at least one of the substrate holder HLD1 and cooling plate holder HLD2 may be made movable up and down. This mechanism makes it possible to facilitate loading/unloading of the insulating substrate SUB into/from the deposition chamber DC1, and adjust the cooling effect of the cooling plate CP2.

The relay chamber RC1 is a relay point for transferring the insulating substrate SUB from the transfer chamber TC1 to the transfer chamber TC2. The relay chamber RC1 contains, e.g., a transfer table. As described above, the relay chamber RC1 is connected to the transfer chamber TC1 via a gate valve. The relay chamber RC1 is also connected to the transfer chamber TC2 via a gate valve. Note that it is not always necessary to use these gate valves.

A vacuum robot VR2 is placed in the transfer chamber TC2. Also, the relay chambers RC1 and RC2 and deposition chambers DC2 to DC5 are connected to the transfer chamber TC2 via gate valves (not shown). The vacuum robot VR2 unloads the insulating substrate SUB from the transfer chambers TC2 to the film formation chambers DC2 to DC5 and relay chamber RC2, and loads the insulating substrate SUB into the transfer chamber TC2 from the relay chamber RC1 and deposition chambers DC2 to DC5.

In this example, the deposition chamber DC2 is a vacuum evaporation chamber for forming a light-emitting layer EMT which emits blue light. The deposition chamber DC2 has substantially the same structure as the deposition chamber DC1. Also, the deposition chamber DC2 contains the same devices as explained in relation to the deposition chamber DC1. In the deposition chamber DC2, however, a blue luminescent organic compound which emits blue light is used as the evaporation material EM. Additionally, in the deposition chamber DC2, a mask having apertures in positions corresponding to blue-emitting ones of the organic layers ORG is used as the mask MSK.

In this example, the deposition chamber DC3 is a vacuum evaporation chamber for forming a light-emitting layer EMT which emits green light. The deposition chamber DC3 has substantially the same structure as the deposition chamber DC1. Also, the deposition chamber DC3 contains the same devices as explained in relation to the deposition chamber DC1. In the deposition chamber DC3, however, a green luminescent organic compound which emits green light is used as the evaporation material EM. Additionally, in the deposition chamber DC3, a mask having apertures in positions corresponding to green-emitting ones of the organic layers ORG is used as the mask MSK.

In this example, the deposition chamber DC4 is a vacuum evaporation chamber for forming a light-emitting layer EMT which emits red light. The deposition chamber DC4 has substantially the same structure as the deposition chamber DC1. Also, the deposition chamber DC4 contains the same devices as explained in relation to the deposition chamber DC1. In the deposition chamber DC4, however, a red luminescent organic compound which emits red light is used as the evaporation material EM. Additionally, in the deposition chamber DC4, a mask having apertures in positions corresponding to red-emitting ones of the organic layers ORG is used as the mask MSK.

In this example, the deposition chamber DC5 is a vacuum evaporation chamber for forming the electron transporting layer ET. The deposition chamber DC5 has substantially the same structure as the deposition chamber DC1. Also, the deposition chamber DC5 contains the same devices as explained in relation to the deposition chamber DC1. In the deposition chamber DC5, however, an electron transporting material is used as the evaporation material EM.

The relay chamber RC2 is a relay point for transferring the insulating substrate SUB from the transfer chamber TC2 to a subsequent vacuum chamber (not shown), e.g., a vacuum chamber for forming the common electrode CE. The relay chamber RC2 contains, e.g., a transfer table. As described above, the relay chamber RC2 is connected to the transfer chamber TC2 via a gate valve. The relay chamber RC2 is also connected to a subsequent vacuum chamber via a gate valve. Note that it is not always necessary to use these gate valves.

A display is manufactured by using the manufacturing apparatus shown in FIG. 4 as follows. First, a partition insulating layer SI and its underlying structure are formed on an insulating substrate SUB. As an example, a 400×500-mm glass substrate is used as the insulating substrate SUB.

The insulating substrate SUB on which the partition insulating layer SI and the like are formed is accommodated in a cassette (not shown). This cassette is placed in the cassette station described previously.

The cassette station has, e.g., a triaxial rotary-arm-type transfer robot. The insulating substrate SUB accommodated in the cassette is transferred into the manufacturing apparatus shown in FIG. 4 by using this transfer robot.

That is, while the gate valve between the load-lock chamber LLC and transfer chamber TC1 is kept closed, that gate valve of the load-lock chamber LLC, which is positioned on the side of the cassette station is opened. In this state, a vacuum is drawn in each chamber except for the load-lock chamber LLC.

Then, the insulating substrate SUB contained in the cassette is placed on the transfer table in the load-lock chamber LLC by using the triaxial rotary-arm-type transfer robot. Subsequently, that gate valve of the load-lock chamber LLC, which is positioned on the side of the cassette station is closed, and the load-lock chamber LLC is evacuated by using the evacuation system connected to it.

After a vacuum is drawn in the load-lock chamber LLC, the gate valve between the load-lock chamber LLC and transfer chamber TC1 is opened, and the insulating substrate SUB is loaded into the transfer chamber TC1 from the load-lock chamber LLC by using the vacuum robot VR1. After that, the gate valve between the load-lock chamber LLC and transfer chamber TC1 is closed.

Then, the gate valve between the transfer chamber TC1 and heating chamber HC is opened, and the insulating substrate SUB is transferred from the transfer chamber TC1 into the heating chamber HC. After the gate valve between the transfer chamber TC1 and heating chamber HC is closed, the insulating substrate SUB is heated by using the heater in the heating chamber HC. In this way, the insulating substrate SUB is dried.

After the insulating substrate SUB is well dried, the gate valve between the transfer chamber TC1 and heating chamber HC is opened, and the insulating substrate SUB is unloaded from the heating chamber HC into the transfer chamber TC1. Then, the gate valve between the transfer chamber TC1 and heating chamber HC is closed, and the gate valve between the transfer chamber TC1 and cooling chamber CC is opened. After that, the insulating substrate SUB is transferred from the transfer chamber TC1 into the cooling chamber CC, and the gate valve between the transfer chamber TC1 and cooling chamber CC is closed.

In the cooling chamber CC, the cooling plate CP1 and insulating substrate SUB are so arranged that the infrared absorption layer IRAL1 of the cooling plate CP1 faces one major surface of the insulating substrate SUB. In this embodiment, the cooling plate CP1 is obtained by adhering, via an adhesive, a 0.1-mm thick infrared absorption layer IRAL1 which mainly contains polyethylene and absorbs 70% of infrared radiation having a wavelength of 5 to 22 µm, onto a metal substrate MS1 made of copper and having the same water-cooling mechanism as that of the metal substrate MS2 shown in FIG. 7.

As described above, the infrared absorption layer IRAL1 of the cooling plate CP1 has infrared absorptance larger than that of the metal substrate MS1. Therefore, the cooling plate CP1 absorbs infrared radiation emitted by the insulating substrate SUB more efficiently than a cooling plate made only of the metal substrate MS1.

Also, the infrared absorption layer IRAL1 is adhered to the metal substrate MS1 via an adhesive layer (not shown). Therefore, almost no fine gaps exist between the infrared absorption layer IRAL1 and adhesive layer, and between the metal substrate MS1 and adhesive layer. As a consequence, heat of the infrared absorption layer IRAL1 is rapidly conducted to the metal substrate MS1.

Accordingly, when a structure capable of radiating heat of the metal substrate MS1 outside the cooing chamber CC is used, the cooling plate CP1 always maintains its high cooling capability. That is, the insulating substrate SUB can be well cooled at high speed.

From the viewpoint of the cooling efficiency, the distance between the cooling plate CP1 and insulating substrate SUB is desirably as short as possible. However, even if the cooling plate CP1 and insulating substrate SUB are brought into contact with each other, a number of fine gaps exist between the infrared absorption layer IRAL1 and insulating substrate SUB, so almost no heat conduction from the cooling plate CP1 to the insulating substrate SUB can be expected. That is, even when the cooling plate CP1 is separated from the insulating substrate SUB, if the distance between the cooling plate CP1 and insulating substrate SUB is sufficiently short, a cooling efficiency substantially equal to that when the cooling plate CP1 and insulating substrate SUB are brought into contact with each other can be obtained.

Accordingly, the distance between the cooling plate CP1 and insulating substrate SUB is typically 0 to 100 mm. In this example, the distance between the cooling plate CP1 and insulating substrate SUB is set to 1 mm.

In the cooling chamber CC, the temperature of the insulating substrate SUB is decreased e.g., from about 70° C. or higher to about 40° C. or lower. When the infrared absorption layer IRAL1 is not formed on the cooling plate CP1, it takes about 500 sec to cool the insulating substrate SUB from 70° C. to 30° C. By contrast, when the infrared absorption layer IRAL1 is formed on the cooling plate CP1, this cooling can be complete in about 160 sec.

After the insulating substrate SUB is well cooled, the gate valve between the transfer chamber TC1 and cooling chamber CC is opened, and the insulating substrate SUB is unloaded from the cooling chamber CC into the transfer chamber TC1 by using the vacuum robot VR1. Then, the gate valve between the transfer chamber TC1 and cooling chamber CC is closed, and the gate valve between the transfer chamber TC1 and deposition chamber DC1 is opened. After that, the insulating substrate SUB is transferred from the transfer chamber TC1 into the deposition chamber DC1 by using the vacuum robot VR1, and the gate valve between the transfer chamber TC1 and deposition chamber DC1 is closed.

In the deposition chamber DC1, the substrate holder HLD1 holds the insulating substrate SUB such that its film formation surface faces down. The cooling plate holder HLD2 holds the cooling plate CP2 such that the infrared absorption layer IRAL2 faces the upper surface of the insulating substrate SUB. As an example, the same structure as the cooling plate CP1 is used as the cooling plate CP2. Also, the distance between the cooling plate CP2 and insulating substrate SUB is set in the same manner as explained for the distance between the cooling plate CP1 and insulating substrate SUB.

The crucible CR is positioned below the insulating substrate SUB. The crucible CR is heated to a temperature at which the evaporation material EM, i.e., a hole transporting material in this example, contained in the crucible CR well evaporates. For example, the crucible CR is heated to 350° C. In addition, the crucible CR is moved at a constant velocity in a direction substantially parallel to the insulating substrate SUB. For example, the crucible CR is moved from one side to its opposite side of the insulating substrate SUB over about 100 sec.

The vaporized evaporation material EM deposits on that surface of the insulating substrate SUB, which faces the crucible CR, through the apertures of the mask MSK. In this way, the heat of the evaporation material EM conducts to the insulating substrate SUB. Furthermore, infrared radiation emitted by the crucible CR is absorbed by the insulating substrate SUB through the apertures of the mask MSK.

The infrared absorption layer IRAL2 of the cooling plate CP2 efficiently absorbs infrared radiation emitted by the insulating substrate SUB. The heat absorbed by the infrared absorption layer IRAL2 is rapidly radiated outside the deposition chamber DC1 in the same manner as described above for the cooling plate CP1.

As described above, although heat energy is supplied to the insulating substrate SUB by evaporation, infrared radiation emitted by the insulating substrate SUB is rapidly radiated outside the deposition chamber DC1. Also, as the insulating substrate SUB is well cooled by the cooling chamber CC, the temperature of the insulating substrate SUB is sufficiently low when evaporation is started. Therefore, while film formation is performed in the deposition chamber DC1, the temperature of the insulating substrate SUB can be controlled within a comparatively narrow temperature range lower than, e.g., about 40° C. That is, it is possible to prevent the temperature of the insulating substrate SUB from varying whenever film formation is performed.

Also, unlike the insulating substrate SUB, the mask MSK is repetitively and continuously used in the deposition chamber DC1. Therefore, the temperature of the mask MSK does not vary whenever film formation is performed.

Accordingly, it is possible to prevent the relative dimensions of the insulating substrate SUB with respect to the mask MSK from varying whenever film formation is performed. As a consequence, a hole transporting layer HT can be formed with high positional accuracy.

After the hole transporting layer HT is thus formed, the gate valve between the transfer chamber TC1 and deposition chamber DC1 is opened, and the insulating substrate SUB is unloaded from the deposition chamber DC1 into the transfer chamber TC1 by using the vacuum robot VR1. Then, the gate valve between the transfer chamber TC1 and deposition chamber DC1 is closed, and the gate valve between the transfer chamber TC1 and relay chamber RC1 is opened. After that, the insulating substrate SUB is transferred from the transfer chamber TC1 into the relay chamber RC1 by using the vacuum robot VR1, and the gate valve between the transfer chamber TC1 and relay chamber RC1 is closed.

Then, the gate valve between the relay chamber RC1 and transfer chamber TC2 is opened. After that, the insulating substrate SUB is transferred from the relay chamber RC1 into the transfer chamber TC2, and the gate valve between the relay chamber RC1 and transfer chamber TC2 is closed.

Subsequently, following substantially the same procedure as explained for the hole transporting layer HT, a blue-emitting layer EMT, green-emitting layer EMT, red-emitting layer EMT, and electron transporting layer ET are sequentially formed in the deposition chambers DC2, DC3, DC4, and DC5, respectively.

The insulating substrate SUB is well cooled when unloaded from the deposition chamber DC1 to the transfer chamber TC1. Also, in each of the deposition chambers DC2 to DC5, as in the deposition chamber DC1, infrared radiation emitted by the insulating substrate SUB is rapidly radiated outside the chamber. In addition, in the deposition chambers DC2 to DC5, as in the deposition chamber DC1, the temperature of the mask MSK does not vary whenever film formation is performed.

Accordingly, in the deposition chambers DC2 to DC5, as in the deposition chamber DC1, it is possible to prevent the relative dimensions of the insulating substrate SUB with respect to the mask MSK from varying whenever film formation is performed. As a consequence, the blue-emitting layer EMT, green-emitting layer EMT, red-emitting layer EMT, and electron transporting layer ET can be formed with high positional accuracy.

After the organic layer ORG is formed as described above, the insulating substrate SUB is transferred from the transfer chamber TC2 to the relay chamber RC2. After that, a common electrode CE and the like are formed to complete the display shown in FIGS. 1 and 2.

As described above, this method can accurately control the temperature of the insulating substrate SUB during film formation. Therefore, the hole transporting layer HT, blue-emitting layer EMT, green-emitting layer EMT, red-emitting layer EMT, and electron transporting layer ET can be formed with high positional accuracy. Consequently, designed performance can be realized.

Materials usable in the cooling plates CP1 and CP2 will be explained below.

As the material of the metal substrates MS1 and MS2, it is possible to use a metal or alloy such as copper, aluminum, iron, silver, Duralumin, stainless steel, or brass. The metal substrates MS1 and MS2 can have any shape as long as the surfaces to be covered with the infrared absorption layers IRAL1 and IRAL2 are substantially flat.

The infrared absorption layers IRAL1 and IRAL2 can be made of any material as long as its infrared absorptance is higher than that of the metal substrates MS1 and MS2. For example, an organic material such as resin or an inorganic compound such as a metal oxide can be used as the material of the infrared absorption layers IRAL1 and IRAL2.

Examples of the organic material usable as the material of the infrared absorption layers IRAL1 and IRAL2 are polyethylene, polytetrafluoroethylene, and resins mainly containing these organic materials. Examples of the inorganic compound usable as the material of the infrared absorption layers IRAL1 and IRAL2 are ceramics such as alumina, quartz, silicon nitride, aluminum nitride, and silicon carbide. The inorganic compound to be used as the material of the infrared absorption layers IRAL1 and IRAL2 can be dispersed in resin. That is, it is also possible to use a mixture of resin and the inorganic compound as the material of the infrared absorption layers IRAL1 and IRAL2.

As a material of the infrared absorption layers IRAL1 and IRAL2, a material having an absorptance of 2% or more with respect to infrared radiation having a wavelength of 5 to 22 µm. An example of the material is glass.

When the material of the infrared absorption layers IRAL1 and IRAL2 contains an organic material, the infrared absorption layers IRAL1 and IRAL2 can be formed by using solution coating or the like. Also, when the inorganic compound is used as the material of the infrared absorption layers IRAL1 and IRAL2, the infrared absorption layers IRAL1 and IRAL2 can be formed by using, e.g., solution coating, vapor deposition, plating, or surface oxidation.

The infrared absorption layers IRAL1 and IRAL2 may also be sheets or films which can be singly handled. In this case, the infrared absorption layer IRAL1 may also be adhered to the metal substrate MS1 by using an adhesive. Likewise, the infrared absorption layer IRAL2 may also be adhered to the metal substrate MS2 by using an adhesive.

The thickness of the infrared absorption layers IRAL1 and IRAL2 may also be, e.g., 1 mm or less. If the infrared absorption layers IRAL1 and IRAL2 are thick, heat conduction from the infrared absorption layers IRAL1 and IRAL2 to the metal substrates MS1 and MS2, respectively, may be interfered with.

The thickness of the infrared absorption layers IRAL1 and IRAL2 may also be, e.g., 50 nm or more. If the infrared absorption layers IRAL1 and IRAL2 are thin, functional deterioration readily occurs due to deterioration of the infrared absorption layers IRAL1 and IRAL2. In addition, thin infrared absorption layers IRAL1 and IRAL2 are difficult to form or handle in some cases.

The infrared absorption layers IRAL1 and IRAL2 may also be covered with a protective layer having infrared absorptance higher than that of these layers. When this protective layer has satisfactorily high physical stability and chemical stability, deterioration of the infrared absorption layers IRAL1 and IRAL2 can be prevented. In addition, if it is necessary to bring the cooling plate in tight contact with the insulating substrate and the infrared absorption layer is made of a viscous material, the cooling plate adheres to the insulating substrate to make substrate transfer impossible, but the protective layer prevents this adhesion. Examples of a material usable as the protective layer are barium fluoride, thallium bromochloride, thallium bromoiodide, potassium bromide, potassium chloride, sodium chloride, cesium iodide, and zinc selenide.

In the above embodiment, the insulating substrate SUB is cooled by using the cooling plates CP1 and CP2. To improve the cooling effect of the cooling plates CP1 and CP2, however, an infrared radiating layer having an infrared radiation ratio higher than that of the insulating substrate SUB may also be formed on the surface opposite to the film formation surface of the insulating substrate SUB.

As the infrared radiating layer, it is possible to use, e.g., a material obtained by dispersing an inorganic material in resin. Examples usable as this inorganic compound are oxides of elements in groups VI to VIII of the short-period periodic table, e.g., $CuO$, $Fe_2O_3$, $CrO_2$, and $MnO_2$, and their mixtures. When these inorganic compounds are mixed, the wavelength region of infrared radiation which can be emitted widens.

The infrared radiating layer can be formed on the insulating substrate SUB by using, e.g., solution coating. The infrared radiating layer may also be a sheet or film which can be singly handled. In this case, the infrared radiating layer can be adhered to the insulating substrate SUB by using an adhesive. If necessary, the infrared radiating layer may also be removed from the insulating substrate SUB after film formation in the deposition chamber DC5 is complete.

Instead of forming the infrared radiating layer on the insulating substrate SUB, an insulating substrate SUB having high infrared absorptance can be used. For example, a glass substrate to which the inorganic compound described above in relation to the infrared radiating layer is added may also be used as the insulating substrate SUB.

In the above embodiment, the cooling plates CP2 are set in all the deposition chambers DC1 to DC5. However, it is not always necessary to set the cooling plates CP2 in all the deposition chambers DC1 to DC5. For example, if the insulating substrate SUB to be loaded into the deposition chamber DC5 is well cooled and a temperature change of the insulating substrate SUB during film formation in the deposition chamber DC5 is sufficiently small without the cooling plate CP2, the cooling plate CP2 need not be set in the deposition chamber DC5.

Although the above embodiment uses the cooling chamber CC containing the cooling plate CP1, the cooling chamber CC need not be used. For example, the cooling chamber CC can be omitted if the insulating substrate SUB can be well cooled by the cooling plate CP1 set in the deposition chamber DC1 before film formation is started in the deposition chamber DC1.

In the above embodiment, the five deposition chambers DC1 to DC5 are used to give the organic layer ORG a threelayered structure and form three types of light-emitting layers EMT different in emission color. However, if the electron transporting layer ET or hole transporting layer HT is omitted, the deposition chamber DC1 or DC5 for forming the layer can be omitted. Also, if only one type of a light-emitting layer EMT is to be formed as the light-emitting layer EMT, two of the deposition chambers DC2 to DC4 can be omitted.

In the above embodiment, the heating chamber HC is used to dry the insulating substrate SUB. However, the heating chamber HC may also be used for another purpose. For example, the heating chamber HC can be used in reflow of each thin film forming the organic layer ORG. In this case, the heating chamber HC is usually placed near a deposition chamber which forms a thin film as an object of reflow.

In the above embodiment, the present invention is applied to a manufacturing apparatus which forms films by vacuum evaporation. However, the present invention is also applicable to a manufacturing apparatus which forms films by another vapor deposition method. For example, the present invention may also be applied to a manufacturing apparatus which forms films by sputtering.

In the above embodiment, the present invention is applied to a single-substrate processing apparatus including multi-chamber system. However, the present invention is also applicable to another manufacturing apparatus. For example, the present invention may also be applied to an in-line batch type manufacturing apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a display which comprises an insulating substrate and a structure formed on the insulating substrate and including a display element, comprising:
    forming a patterned layer as a portion of the structure on the insulating substrate by vapor deposition in vacuum using a mask; and
    cooling the insulating substrate before and/or during formation of the patterned layer by arranging a cooling plate which comprises a metal substrate and an infrared absorption layer covering a main surface of the metal substrate and being larger in infrared absorbance than the metal plate such that the infrared absorption layer faces the insulating substrate.

2. The method according to claim 1, wherein the infrared absorption layer is made of resin and/or metal oxide.

3. The method according to claim 1, wherein the vapor deposition is vacuum evaporation or sputtering.

4. The method according to claim 1, wherein the cooling plate is arranged such that the cooling plate and the insulating substrate are spaced apart from each other.

5. The method according to claim 1, wherein the display element is an organic EL element, and the patterned layer is a portion of the organic EL element.

6. A method of manufacturing a display which comprises an insulating substrate and a structure formed on the insulating substrate and including a display element, comprising:
    arranging the insulating substrate and a first cooling plate which comprises a first metal substrate and a first infrared absorption layer covering a main surface of the first metal substrate and being larger in infrared absorbance than the first metal plate in vacuum such that the first infrared absorption layer faces a first main surface of the insulating substrate; and
    in this state, forming a first patterned layer as a portion of the structure on a second main surface of the insulating substrate by vapor deposition using a first mask.

7. The method according to claim 6, further comprising forming a second patterned layer as a portion of the structure on the second main surface of the insulating substrate by vapor deposition in vacuum using a second mask after forming the first patterned layer.

8. The method according to claim 6, further comprising:
    arranging the insulating substrate and a second cooling plate which comprises a second metal substrate and a second infrared absorption layer covering a main surface of the second metal substrate and being larger in infrared absorbance than the second metal plate in vacuum after forming the first patterned layer such that the second infrared absorption layer faces the first main surface of the insulating substrate; and
    in this state, forming a second patterned layer as a portion of the structure on the second main surface of the insulating substrate by vapor deposition using a second mask.

9. A method of manufacturing a display which comprises an insulating substrate and a structure formed on the insulating substrate and including a display element, comprising:
    heating the insulating substrate in vacuum; cooling the heated insulating substrate in vacuum by arranging the insulating substrate and a first cooling plate which comprises a first metal substrate and a first infrared absorption layer covering a main surface of the first metal substrate and being larger in infrared absorbance than the first metal plate such that the first infrared absorption layer faces the insulating substrate; and
    forming a patterned layer as a portion of the structure on the cooled insulating substrate by vapor deposition in vacuum using a mask.

10. The method according to claim 9, wherein forming the patterned layer includes:
    arranging the insulating substrate and a second cooling plate which comprises a second metal substrate and a second infrared absorption layer covering a main surface of the second metal substrate and being larger in infrared absorbance than the second metal plate in vacuum such that the second infrared absorption layer faces a first main surface of the insulating substrate; and
    in this state, forming the patterned layer on a second main surface of the insulating substrate by vapor deposition using the mask.

11. The method according to claim 9, wherein heating the insulating substrate includes drying the insulating substrate.

* * * * *